(12) United States Patent
Kuczynski et al.

(10) Patent No.: US 7,785,431 B2
(45) Date of Patent: Aug. 31, 2010

(54) COMPRESSIBLE PLATE FOR FLEXOGRAPHIC PRINTING, AND PROCESS FOR OBTAINING

(75) Inventors: Jerzy Kuczynski, Zillisheim (FR); Michel Schanen, Guewenheim (FR); Laurent Teixera, Munchhouse (FR); Gerard Rich, Orschwihr (FR); Hugues Serain, Watwiller (FR)

(73) Assignee: MacDermid Printing Solutions Europe SAS, Cernay (FR)

( * ) Notice: Subject to any disclaimer, the term of this patent is extended or adjusted under 35 U.S.C. 154(b) by 231 days.

(21) Appl. No.: 11/586,219

(22) Filed: Oct. 25, 2006

(65) Prior Publication Data
US 2007/0042231 A1 Feb. 22, 2007

Related U.S. Application Data

(62) Division of application No. 10/168,931, filed as application No. PCT/FR00/03699 on Dec. 27, 2000, now Pat. No. 7,384,685.

(30) Foreign Application Priority Data

Dec. 31, 1999 (FR) .................................. 99 16815

(51) Int. Cl.
*B32B 3/00* (2006.01)
*B32B 7/10* (2006.01)

(52) U.S. Cl. ................... 156/77; 156/78; 156/275.5; 156/307.1; 430/286.1

(58) Field of Classification Search .................. 156/77, 156/78, 275.5, 307.1; 430/286.1; 522/120, 522/121; 428/313.3, 313.5, 318.4, 318.6, 428/319.3; 526/340
See application file for complete search history.

(56) References Cited

U.S. PATENT DOCUMENTS

| | | | |
|---|---|---|---|
| 3,030,346 A * | 4/1962 | Cooper, Jr. | 526/73 |
| 3,700,541 A * | 10/1972 | Shrimpton et al. | 428/313.5 |
| 4,369,246 A * | 1/1983 | Chen et al. | 430/306 |
| 4,430,417 A * | 2/1984 | Heinz et al. | 430/286.1 |
| 4,547,453 A * | 10/1985 | Worns et al. | 430/271.1 |
| 4,582,777 A | 4/1986 | Fischer et al. | |
| 4,771,078 A * | 9/1988 | Schisler et al. | 521/50.5 |
| 5,034,268 A * | 7/1991 | Sekidou et al. | 442/226 |
| 5,183,613 A * | 2/1993 | Edwards | 264/173.19 |
| 5,275,102 A * | 1/1994 | Prittie | 101/395 |
| 5,700,343 A | 12/1997 | Castelli et al. | |
| 5,704,291 A | 1/1998 | Lewis | |

FOREIGN PATENT DOCUMENTS

| | | |
|---|---|---|
| EP | 0 057 593 | 8/1982 |
| EP | 0 177 302 | 4/1986 |
| WO | 96/40528 | 12/1996 |

* cited by examiner

*Primary Examiner*—Michael A Tolin
(74) *Attorney, Agent, or Firm*—Carmody & Torrance LLP (57) ABSTRACT

The invention concerns a compressible plate for flexographic printing, designed to be positioned on a support cylinder of a printing machine. The invention is characterized in that said plate (1) comprises a photopolymer layer (10) and a compressible layer (11) made of a material exhibiting voids forming between 10 and 60% by volume of said compressible layer, the material comprising at least 70% by weight of a polymer or a mixture of polymers chemically compatible with the photopolymer.

11 Claims, 2 Drawing Sheets

FIG. 5

COMPRESSIBLE PLATE FOR FLEXOGRAPHIC PRINTING, AND PROCESS FOR OBTAINING

This application is a divisional of U.S. application Ser. No. 10/168,931, filed Sep. 10, 2002, now U.S. Pat. No. 7,384,685, which was the National Stage of International Application No. PCT/FR00/03699, filed Dec. 27, 2000, which designated the U.S., claims the benefit thereof and incorporates the same by reference.

The invention relates to a compressible plate for flexographic printing which is intended to be positioned on a support cylinder of a printing machine.

There are known numerous printing plates which comprise a photopolymer layer placed on a support, which is generally a polyester film. Prior to use of the printing plate, the photopolymer layer is developed to receive the image to be printed. Such development comprises exposing the photopolymer layer to UV light through a mask, the unexposed zones of the photopolymer layer then being dissolved away by a solvent. As a result, there is obtained a layer with relief, which will make it possible to reproduce the image.

After development, the printing plates are mounted on a support cylinder of a printing machine, especially by means of double-sided adhesives.

It has already become obviously necessary that the compressibility of a printing plate must be adjusted, in particular to control the pressure in the nip, or in other words the pinch zone between two cylinders. Adjustment of the compressibility also makes it possible to increase productivity and to improve printing quality, especially in four-color printing.

The compressibility can be adjusted by means of a double-sided adhesive used for fixation of the plate on the support cylinder, this double-sided adhesive being itself compressible.

Unfortunately, this type of adhesive is cumbersome. In addition, it has a serious adverse effect on the printer's budget and necessitates complex and successive mounting operations.

Another solution known in the prior art comprises placing a compressible layer between the photopolymer layer and the support.

For example, U.S. Pat. No. 4,582,777 describes a compressible

For example, U.S. Pat. No. 4,582,777 describes a compressible plate which, starting at a support film intended to be mounted on a printing cylinder, is provided with an adhesive, a compressible layer, another adhesive and a photopolymer layer.

Production of this printing plate is a complex process, since it necessitates the presence of an adhesive between two successive layers. Thus the production costs are high.

European Patent 264894 describes an intermediate layer which acts as a barrier between a photopolymer layer and an intermediate elastomer layer disposed between the photopolymer layer and the support layer. This intermediate layer can be compressible.

The barrier layer ensures that solvents used to develop the photopolymer layer cannot penetrate into the intermediate layer. Nevertheless, its presence complicates the production of the compressible plate and also adversely impacts its cost.

In addition, none of these compressible printing plates has found an industrial application, which tends to show that they have not proven satisfactory.

The primary object of the invention is to alleviate these disadvantages by proposing, for flexographic printing, a compressible plate which does not necessitate the use of compressible double-sided adhesives and which can be made simply, while achieving high printing quality.

In addition, the printers must sometimes deal with contradictory requirements in the same printing plate.

For example, a heavy printing pressure facilitates copious ink transfer, with "leveled" printing. This heavy printing pressure improves the print quality of full tones.

On the other hand, light printing pressure makes it possible to optimize printing quality in four-color printing. This relatively light printing pressure is generally obtained by a soft compressible layer. It ensures that printing of faithful tone and better relief can be achieved, with little over-inking in the screened zones.

A compromise cannot always be achieved, to the point that two printing plates are often necessary to print the same color for a given subject. Thus a printer is often forced to use a plate mounted on a hard support to print texts and full tones and a second printing plate of identical nature but with a complementary image, mounted on a soft compressible assembly, in order to print half-tones.

Another objective of the invention is to obviate the use of these two plates and to provide a printing plate whose compressibility is not uniform over the entire printing plate, this plate thus being able to achieve optimal printing quality for both full tones and four-color printing.

Finally, the printing plates known in the prior art are delivered in the form of sheets of given size, typically 1016 mm×1524 mm, or else 1321 mm×2032 mm.

This configuration as sheets is necessitated by the presence of a rigid support layer on one side of the plate and of an equally rigid protective film on the other side of the plate, or in other words on the photosensitive layer.

This configuration results in large losses, of at least 10%, when the printers trim the plates to printing size before mounting them on the support cylinder of a printing machine.

These losses adversely impact the cost of printing plates even more.

Another object of the invention is to break away from these sizes in order to limit the losses during trimming of the printing plates.

The primary object of the invention is therefore a compressible flexographic printing plate, intended to be positioned on a support cylinder of a printing machine, this plate comprising a photopolymer layer and a compressible layer of a material containing voids forming between 10 and 60% of the volume of this compressible material, the material including at least 70% by weight of a polymer or of a polymer mixture that is chemically compatible with the photopolymer.

Throughout the description, it will be understood that a given polymer is chemically compatible with another polymer when their solubility parameters are similar and in particular when the difference thereof is less than or equal to 1.

The concept of solubility parameter is well defined for the person skilled in the art. It is defined in, for example, "Polymer Handbook", by J. Brandrup and E. M. Immergut, 1975, Wiley Interscience Publications, John Wiley & Sons, particularly in Chapter IV, pp. 337 ff.

For most of these polymers, the value of the solubility parameter can be determined directly or indirectly by means of solvents.

Certain polymers have several different phases, each having a specific solubility parameter. In particular, this is the case of SEBS, which has a rigid styrene phase and an elastomeric phase based on isobutylene and ethylene.

For this type of polymer, the solubility parameter of the phase representing the largest volume will be used for comparison with the value of the solubility parameter of another polymer, in order to determine whether or not these two polymers are compatible.

In practice, chemically similar polymers are compatible. This is the case, for example, of SIS with SBS or SEBS, and of a PU (polyurethane) polyester with another PU of polyester type.

In addition, the bond between the photopolymer layer and the compressible layer can be established chemically, without the need to provide an adhesive layer.

In fact, the compatible polymers of the compressible layer and of the photopolymer layer will have a tendency to create an interdiffusion zone at the interface, thus achieving strong adhesion.

The compressible plate according to the invention is therefore simpler in its production and necessarily less costly that the compressible plates known in the prior art, since it does not necessitate a bonding layer.

In addition, through appropriate choice of the materials used, it is also possible to prevent migration of monomers from one layer to the other. This also ensures that the presence of a barrier layer is not required and that long-term stability of the structure and composition of each of the two layers is achieved when they are in contact.

Thus the monomers contained in the photopolymer layer, and especially the cross-linking agents such as the acrylates, will not migrate toward the compressible layer if their solubility parameter is closer to that of the photopolymer than that of the polymers of the compressible layer. The same is true of other ingredients of the formulation, including the photoinitiators.

Conversely, if the compressible layer contains monomers that, as will be seen hereinafter, are activated after production of the printing plate, these monomers do not migrate toward the photopolymer layer if their solubility parameter is closer to that of the polymers of the compressible layer than that of the photopolymer.

In an advantageous embodiment of the printing plate according to the invention, the voids present in the compressible layer are composed of expanded microspheres. These microspheres then represent between 1 and 10% by weight of the material of which the compressible layer is composed.

In addition, the compressible layer contains between 0.1 and 3% by weight of protective agents, chosen in particular from among the antioxidants, the non-staining ozone-inhibitors of the phenolic type or the waxes, used individually or as a mixture.

Preferably the compressible layer comprises a base polymer chosen from one of the following groups:

elastomers of the styrene copolymer type, such as simple and modified styrene-isoprene-styrene copolymer (SIS), styrene-butadiene-styrene copolymer (SBS), styrene-diene-styrene copolymer (SDS), styrene-branched butadiene copolymer ((S-B)x), styrene-ethylene, butylene-styrene copolymer (SEBS), styrene-ethylene, propylene-styrene copolymer (SEPS); these elastomers being mixed as the case may be with double-block copolymers containing, for example, vinyl groups, grafted chains of isoprene, silanes or anhydrides;

thermoplastic elastomers obtained by dynamic vulcanization, such as the mixtures of polypropylene/ethylene-propylene-diene terpolymer type (PP/EPDM) or propylene/butadiene-acrylonitrile copolymer type (PP/NBR);

pure or modified thermoplastic polyurethanes or even such polyurethanes cross-linked with the isocyanates, examples being thermoplastic polyurethane (TPU) or TPU modified with silane functionalities;

elastomers of acrylonitrile type, such as butadiene-acrylonitrile copolymer (NBR), carboxylated butadiene-acrylonitrile copolymer (XNBR), hydrogenated butadiene-acrylonitrile copolymer (HNBR) and elastomers of functionalized butadiene-acrylonitrile copolymer type (NBR).

The compressible layer can also be provided with, in addition to the base polymer, another polymer or polymeric or elastomeric additives that are chosen from one or more of the following groups:

functionalized polyolefins, such as ethylene copolymers with vinyl acetate (EVA), with vinyl alcohol (EVOH) or acrylate ester (ethoxylated bisphenol A diacrylate (EBA), ethyl methacrylate (EMA));

terpolymers of ethylene, vinyl acetate or acrylate ester with maleic anhydride or glycidyl methacrylate, polymers of ethylene and octene, of propylene and hexene or decene, amide polyester or polyether, elastomers of the ethylene-propylene-diene terpolymer type (EPDM), butadiene-acrylonitrile copolymer type (NBR) or hydrogenated butadiene-acrylonitrile copolymer type (HNBR).

This or these other polymer(s) or polymeric and elastomeric additive(s) makes or make it possible to adjust the mechanical properties of the compressible layer.

The compressible layer of the printing plate according to the invention can also contain coagents, chosen in particular from among the monofunctional and multifunctional acrylates and methacrylates, such as hydroxypropyl methacrylate (HPMA), trimethylol propane triacrylate (TMPTA), trimethylolpropane trimethyl acrylate (TMPTMA), hexanediol 1,6-diacrylate (HDDA), or glycerol 1,3-dimethacrylate (GDMA), alone or in combination.

The coagents are radical cross-linking promoters, and can be used to enhance the cross-linkability of the compressible layer.

The compressible layer can also contain functional polymers chosen in particular from among the liquid polymers, examples being ethylene-propylene-diene terpolymer (EPDM), 1,2-polybutadiene (PB), hydroxy or epoxy poly (ethylene/butylene), or functionalized butadiene-acrylonitrile copolymer (NBR).

These liquid polymers are polymeric plasticizers.

The definitions of the compounds will be the same throughout the description, even if they are merely designated by their abbreviations hereinafter.

The compressible layer of the flexographic printing plate according to the invention can also contain mineral fillers, especially such as pure or surface-modified silica, silicates, carbonates or stearates.

By means of these fillers it is possible to adjust the mechanical properties of the compressible layer.

Coloring agents can also be provided in the compressible layer, especially pigments and organic coloring agents, used in pure form or as mixtures.

By means of the coloring agents it is possible to adjust the capacity of the compressible layer to absorb UV light.

UV absorbers could also be incorporated in the formulation of the compressible layer.

Preferably, the constituents of the compressible layer are present in the following proportions by weight:

| | |
|---|---|
| base polymer: | from 35 to 90% |
| other polymer or polymeric or elastomeric additives: | from 0 to 60% |
| coagents and functional polymers: | from 0 to 20% |
| fillers: | from 0 to 10% |
| microspheres: | from 1 to 10% |
| coloring agents: | from 0 to 1% |
| UV absorbers: | from 0 to 0.5% |
| protective agents: | from 0.1 to 3% |

In a preferred embodiment, the compressible layer of the flexographic printing plate according to the invention is provided with at least one functional monomer that has not yet reacted with the other polymer-type constituents of the compressible layer during production of the plate, and that is capable of being activated at a later time under the effect of a defined influence, to create or destroy other bonds between the polymer chains.

If it is desired that the compressible plate contain several different systems capable of being activated after production of the plate in order to create or destroy bonds between the polymer chains, it is advisable to provide as many functional monomers or mixtures of functional monomers as there are such systems.

By virtue of the presence of these functional monomers, it is possible to modify the compressibility of the flexographic printing plate after production thereof. As a result, zones of different compressibility, distributed in such a way that the plate is endowed with printing quality for both full tones and half-tones, can be obtained in the interior of the same printing plate.

Preferably the functional monomer(s) is or are chosen from among the monofunctional and multifunctional acrylates and methacrylates, especially such as hydroxypropyl methacrylate (HPMA), trimethylol propane triacrylate (TMPTA), trimethylolpropane trimethyl acrylate (TMPTMA), hexanediol 1,6-diacrylate (HDDA), or glycerol 1,3-dimethacrylate (GDMA), alone or in combination.

These monomers are activated by UV light.

Advantageously there is mixed in the compressible layer containing this or these functional monomer(s) at least one photoactivator or photoinitiator, especially one that can be used to develop a photosensitive layer and that preferably is temperature-resistant. This photoactivator or photoinitiator can in particular be of the KIP 150 or Esacure® KTO46 type.

The presence of this photoactivator or photoinitiator promotes the reaction of the monomers in the presence of UV light.

This or these functional monomer(s) advantageously represent(s) between 2 and 10% by weight of the compressible layer, while this or these photoactivator(s) or photoinitiator(s) advantageously represent(s) between 0 and 5% by weight of the compressible layer.

Thus the compressible layer of the printing plate according to the invention can advantageously contain a functional monomer which makes it possible to create, under UV irradiation, which is applied, for example, during development of the photosensitive layer of the printing plate, additional chains between the polymer-type constituents of the compressible layer.

The printing plate according to the invention can also include a base layer between the photopolymer layer and the compressible layer, this base layer being made of a material that is chemically compatible with the polymers of the photopolymer layer and of the compressible layer.

Advantageously the flexographic printing plate according to the invention is provided with a stabilization layer between the photopolymer layer and the compressible layer.

This stabilization layer is configured, for example, in the form of an elastomeric layer, chemically compatible with the photopolymer and with the polymer(s) of the compressible layer, provided with woven or nonwoven fibrous reinforcement.

The function of this layer is to limit the deformation of the image in the circumferential direction during printing, in the contact zone subjected to pressure. This layer offers a better guarantee that register will be maintained and that the images will be reproduced more faithfully.

Another function of this stabilization layer is to guarantee sufficient dimensional stability of the compressible plate in its plane during the manipulations before it is positioned on a cylinder or sleeve, especially in the specific case in which the plate is not provided with a rigid support layer, as will be described hereinafter.

Advantageously, the flexographic printing plate according to the invention can also contain a contrast layer at the surface of the photopolymer layer.

Such a contrast layer is described in particular in European Patent 0456336, which can be consulted for particulars.

The flexographic printing plate according to the invention can also contain, at the surface of the photopolymer layer, a layer on which an image can be formed on the photopolymer layer by digital means.

Such a layer is described in particular in International Patent Application PCT 97/25206, which can be consulted.

The flexographic printing plate according to the invention can be configured in the form of a sheet of defined size or else in the form of a roll.

The configuration in the form of a roll is made possible by the fact that the printing plate according to the invention does not have to be provided with a rigid support layer or protective sheet, in contrast to the plates known in the prior art.

This configuration in the form of a roll allows the user to trim the printing plates to the desired size before development of the photosensitive layer to generate an image.

The configuration in the form of a roll makes it possible to limit the trimming losses compared with a configuration in fixed sizes.

When the printing plate according to the invention is configured in the form of a sheet, it can be advantageously provided on its inner face with a film of plastic or metal material, which ensures better dimensional stability of the plate while it is being manipulated before being positioned on a cylinder.

Regardless of whether the plate is configured as a sheet or as a roll, it can be advantageously provided on its inner face with a self-sealing adhesive. This allows the compressible plate to be attached to a support film, which itself is mounted on the printing machine or on a printing sleeve such as that described in European Patent 0683040, which can be consulted.

This self-sealing adhesive is provided on the film of plastic or metal material when the printing plate contains such a film.

The presence of a self-sealing adhesive on the inner face of the compressible plate simplifies the mounting thereof and limits the quantity of consumable products to be purchased and used by the printer.

The invention also relates to a flexographic printing plate such as described hereinabove wherein the photopolymer layer has been developed.

The invention also relates to a process for making a flexographic printing plate comprising a photopolymer layer, this process having the following stages:

preparation of a mixture containing at least 70% by weight of one or more polymers that are chemically compatible with the photopolymer and 1 to 10% by weight of microspheres in the expanded or non-expanded state or of mixtures of two types of macrospheres or of blowing agents;

extrusion of this mixture, during which the mixture expands to form a compressible layer containing a multiplicity of voids;

extrusion of the photopolymer to form the photopolymer layer;

rolling of the photopolymer layer against the previously formed compressible layer, the pressure of one layer against the other making them adhere to one another; and activation of a system to create, in the compressible layer, long interlinked polymer chains, wherein this activation stage can be performed before, during or after rolling of the photopolymer layer against the compressible layer.

In a first embodiment of the process, the system for creating interlinked chains is a cross-linking system, which is activated, for example, by heat, by isocyanates, by electron bombardment or else by X-rays.

In another embodiment of the process, this system for creating interlinked chains comprises anchoring the polymer chains by the intermediary of a crystal phase at working temperature or at room temperature.

Advantageously, the cross-linking of at least one part of the mixture constituting the compressible layer is performed during extrusion of the mixture, in the case of a system with cross-linking of thermal type.

The process according to the invention can also have a stage of correcting the size of the compressible layer or of straightening it after it has been extruded, to guarantee constant nominal thickness.

Preferably the compressible layer has a thickness of between 0.5 and 4.0 and especially of between 0.5 and 1.5 mm.

The process according to the invention is simple to use compared with the known production processes, and it permits a productivity gain as high as 30%.

The mixture advantageously contains between 0.1 and 3% by weight of protective agents, chosen in particular from among the antioxidants, the non-staining ozone-inhibitors of the phenolic type or the waxes, used individually or as a mixture.

Preferably the mixture comprises a base polymer chosen from one of the following groups:

elastomers of the styrene copolymer type, such as simple and modified SIS, SBS, SDS, (S-B)x, SEBS, SEPS as well as mixtures of such elastomers with double-block copolymers containing vinyl groups, grafted chains of isoprene, silanes or anhydrides;

thermoplastic elastomers obtained by dynamic vulcanization, such as, for example, the mixtures of PP/EPDM or PP/NBR type;

pure or modified thermoplastic polyurethanes or even such polyurethanes cross-linked with the isocyanates, examples being TPU or TPU modified with silane functionalities;

elastomers of the acrylonitrile type, such as NBR, XNBR, HNBR and functionalized NBR elastomers.

The mixture can also be provided with, in addition to the base polymer, another polymer or polymeric or elastomeric additives that are chosen from one or more of the following groups:

functionalized polyolefins, such as ethylene copolymers with vinyl acetate (EVA), with vinyl alcohol (EVOH) or acrylate ester (EBA, EMA);

terpolymers of ethylene, vinyl acetate or acrylate ester with maleic anhydride or glycidyl methacrylate, copolymers of ethylene and octene, or of propylene and hexene or decene, amide polyester or polyether, elastomers of the EPDM, NBR or HNBR type.

The mixture of which the compressible layer is composed can also contain coagents, chosen in particular from among the monofunctional and multifunctional acrylates and methacrylates, such as HPMA, TMPTA, TMPTMA, HDDA, or GDMA, alone or in combination.

The mixture can also contain functional polymers chosen in particular from among the liquid polymers, examples being EPDM, 1,2-PB, hydroxy or epoxy poly(ethylene/butylene), or functionalized NBR.

This mixture can also contain mineral fillers, especially such as pure or surface-modified silica, silicates, carbonates or stearates.

Coloring agents can also be provided in the mixture, especially pigments and organic coloring agents, used in pure form or as mixtures.

The different constituents of the mixture that permit formation of the compressible layer are advantageously present in the following proportions by weight:

| | |
|---|---|
| base polymers: | 35 to 90% |
| other elastomer or polymeric or elastomeric additives: | 0 to 60% |
| coagents and functional polymers: | 0 to 20% |
| fillers: | 0 to 10% |
| microspheres or blowing agents: | 1 to 10% |
| coloring agents: | 0 to 1% |
| UV absorbers: | 0 to 0.5% |
| protective agents: | 0.1 to 3% |

By virtue of the presence of microspheres or of chemical blowing agents in a proportion of 1 to 10% by weight of the mixture, it is possible to obtain in the extruded compressible layer a void ratio of 10 to 60% by volume. This ratio corresponds to the volume fraction of gas present in the compressible layer after production.

Preferably the compressible layer has closed cells, which are more resistant mechanically and chemically.

The microspheres contain a solvent which, under the effect of heat at around 100 to 150° C., causes expansion of the microspheres.

The blowing agents in turn have the effect of chemically expanding the compressible layer during the hardening phase.

The process according to the invention also comprises providing, in the mixture with which the compressible layer is formed, at least one functional monomer that does not react with the other constituents of the polymer type of the compressible layer and which can be activated at a later time under the effect of a defined influence.

Preferably the functional monomer(s) is or are chosen from the monofunctional and multifunctional acrylates and methacrylates, especially such as HPMA, TMPTA, TMPTMA, HDDA, or GDMA, alone or in combination.

This or these functional monomer(s) is or are advantageously mixed with at least one photoactivator or photoinitiator, especially one that can be used to develop a photosensitive layer.

When the process comprises providing such monomers in the mixture, it advantageously includes an additional stage in which this or these functional monomer(s) is or are activated in order to modify the compressibility of the printing plate selectively.

In the compressible plate obtained by the process according to the invention, the photopolymer layer advantageously has a thickness of between 0.4 and 2.5 mm.

The process according to the invention can also include another stage comprising forming a base layer between the photopolymer layer and the compressible layer.

The base layer preferably has a thickness of between 0.1 and 2 mm.

It can also include an additional stage for formation of a stabilization layer between the photopolymer layer and the compressible layer, this layer being configured in the form of an elastomeric layer reinforced by a fibrous reinforcement, this elastomer being chemically compatible with the polymers of the photopolymer layer and of the compressible layer.

This stabilization layer preferably has a thickness of between 0.2 and 0.5 mm.

The invention will be better understood and other objectives, advantages and characteristics thereof will become clearer upon reading the description provided hereinafter of non-limitative practical examples of the invention with reference to the attached figures, wherein.

In FIGS. 1 to 4, the photopolymer layer is schematically illustrated in undeveloped form on the right side of these figures and in developed form on the left side of these figures.

A compressible plate is generally delivered to the photoengravers with an undeveloped photosensitive layer, as illustrated on the right side of these figures. It can also be delivered directly to a printer, after development of the photopolymer layer (as illustrated on the left side of these figures).

Figure 1:
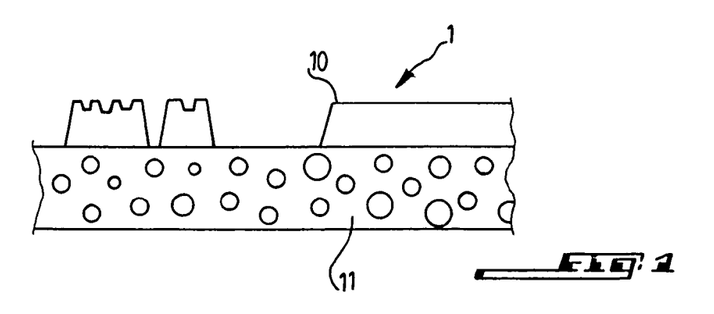
FIG. 1 is a schematic view in section of a compressible plate according to the invention, comprising a photopolymer layer and a compressible layer.

Referring now to FIG. 1, there is illustrated the basic version of the compressible printing plate according to the invention.

This plate 1 is provided with a photopolymer layer 10 and a compressible layer 11.

In the example illustrated in FIG. 1, this compressible layer 11 is made with SEBS as its base, while photopolymer layer 10 is made with SIS.

This compressible layer 11 is made from a mixture comprising 76% by weight of SEBS, 16% by weight of a polymer of functionalized olefin type, 5% by weight of multi-acrylates, 2% by weight of expandable microspheres of Expancell® type (registered trademark of the AKZO NOBEL Co.) and of the DU type, and 1% by weight of protective agents of the phenolic type, such as Irganox® 1010.

This mixture is first extruded and voids are created in the interior of the mixture by virtue of the microspheres, which expand during extrusion under the effect of the solvent that they contain.

The elastomer layer is then cross-linked by electron bombardment with a dose of 25 to 250 kGy to obtain optimal mechanical stability and also resistance to chemical expansion.

The efficacy of electron bombardment is enhanced by the fact that multi-acrylates are present in the mixture.

Consequently, compressible layer 11 is not affected by solvent attack during development of the image of photopolymer layer 10 and during flexographic printing.

The compressible layer obtained has a modulus of elasticity, measured in plane compression between two parallel platens, on the order of 6 MPa.

In general, the modulus of elasticity of a compressible layer for a printing plate according to the invention ranges between 1 and 25 MPa and preferably between 2 and 15 MPa.

This photopolymer layer is therefore made with a base of SIS and a photoinitiator as described in European Patent 0456336. Thus this layer is made starting from a mixture comprising approximately: 85% by weight of SIS, 4% by weight of HDDA, 3% by weight of HDDMA, 1.4% by weight of a photoinitiator of the Irgacure 651® type, 1.4% by weight of 2,6-di-t-butyl-p-cresol, 0.2% by weight of calcium stearate, 0.64% by weight of an ozone-inhibiting paraffin wax, 4.3% by weight of a depolymerized polyisoprene, 0.02% by weight of Tinurin 1130® and 0.04% by weight of an antioxidant of the Irganox 1010® type of the Ciba Geigy Co.

This mixture is extruded and then applied with a certain pressure against previously formed compressible layer 11.

This pressure causes adhesion between the two layers 10 and 11, because of the fact that the two materials are chemically compatible.

In fact, for this photopolymer layer 10 and this compressible layer 11, the monomers having the solubility parameters listed below can be considered:

| Section of polymer under consideration | Value of solubility parameter | Unit |
|---|---|---|
| Polyisoprene (in SIS polymer) | 8.2 | $(cal/cm^3)^{1/2}$ |
| Polyisobutylene (in SEBS) | 7.85 | $(cal/cm^3)^{1/2}$ |
| Polyethylene (in SEBS) | 7.7 | $(cal/cm^3)^{1/2}$ |
| Polystyrene (in SIS) | 9.1 | $(cal/cm^3)^{1/2}$ |
| (in SEBS) | 8.5 to 10.6 | |
| Acrylates and methacrylates | 8.3 to 8.9 | $(cal/cm^3)^{1/2}$ |

The solubility parameter of the SIS used here is about 8.2. In fact, this particular SIS has low styrene content and it exhibits substantially the same solubility parameter as the polyisoprene section.

In addition, the solubility parameter of the elastomeric phase corresponding to the polyisobutylene and polyethylene sections, which are present in substantially equal quantities in the SEBS under consideration, are used for the SEBS. The solubility parameter of the SEBS is therefore around 7.8.

Thus the difference between the two solubility parameters is much less than 1, and so the SIS and the SEBS are compatible.

In addition, this table reveals that the values of the solubility parameters of the acrylates and methacrylates are much closer to the solubility parameter of the polyisoprene section contained in the SIS of the photopolymer layer than to the solubility parameter of the polyethylene section in the SEBS of the compressible layer.

Consequently, the acrylates contained in the photopolymer layer do not tend to migrate toward the compressible layer.

It is also known that SIS and SEBS are chemically similar.

For example, the polystyrene blocks or segments are soluble in one another, the only limitation being the influence of the molecular weight of the segments. Furthermore, the solubility parameter of polyisoprene differs from that of polyethylene or from that of polyisobutylene merely by a value smaller than 0.5.

This chemical compatibility between the polymers used in the two layers immediately assures excellent adhesion and good continuity between the two layers 10 and 11.

In addition, migration or diffusion of unreacted monomers from layer 10 to layer 11 or vice versa cannot occur, specifically for thermodynamic reasons.

Because of this absence of migration, these monomers cannot alter, in the course of time, one or the other of these two layers bonded to one another.

This has been verified experimentally by an accelerated aging test.

It was performed in an oven at 45° C. with graduated durations of 7, 14, 21 and 28 days, in a direct comparison between the plate according to the invention and a reference plate of EPIC type (commercial product of Polyfibron). The measurements of hardness and of plane compression between platens performed after each aging period did not reveal any noteworthy evolution in one direction or the other for the two plates.

Compressible plate 1 according to the invention is stable, and there is no need to provide a support layer on the back, or in other words on the side of the compressible layer opposite the photopolymer layer, this support layer generally being composed, in the prior art, of a polyester film.

Thus the compressible plate according to the invention can be configured just as well in the form of a sheet as of a roll. As indicated hereinabove, this configuration as a roll represents a gain on the order of 10% in trimming efficiency.

Thus the printing plate according to the invention can be fixed directly on a cylinder of a printing machine by the intermediary of a double-sided adhesive on its back.

The printing plate is developed by the usual technique. This step is advantageously performed after the plate has been fixed on a support film or on a sleeve.

Figure 2:
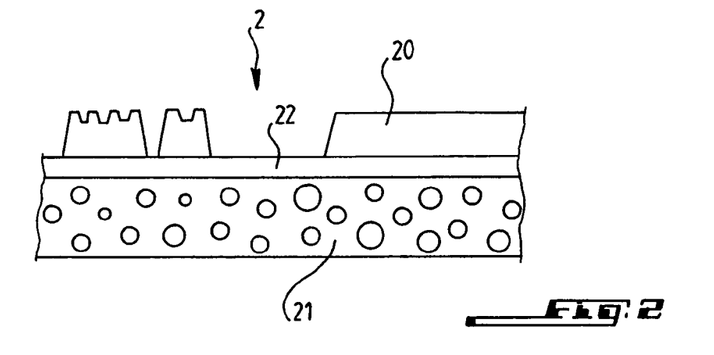
FIG. 2 is a schematic view in section of a compressible plate according to the invention, including a base layer between the compressible layer and the photopolymer layer.

Referring now to FIG. 2, printing plate 2 according to the invention can also be provided with a base layer 22 between photopolymer layer 20 and compressible layer 21.

For reasons of simplicity, the base layer can be made of the same photopolymeric material as photopolymer layer 20 containing the image. It can also be made of a different material, provided it is chemically compatible with the polymers of photopolymer layer 20 and of compressible layer 21.

This base layer is preferably formed by irradiation of the back of the photopolymer layer before or after extrusion of the compressible layer.

This exposure of the back is made possible by the fact that compressible layer 21 is transparent to UV radiation. As indicated above, the presence of coloring agents in compressible layer 21 makes it possible to adjust the ability of the compressible layer to absorb or transmit UV light.

Figure 3:
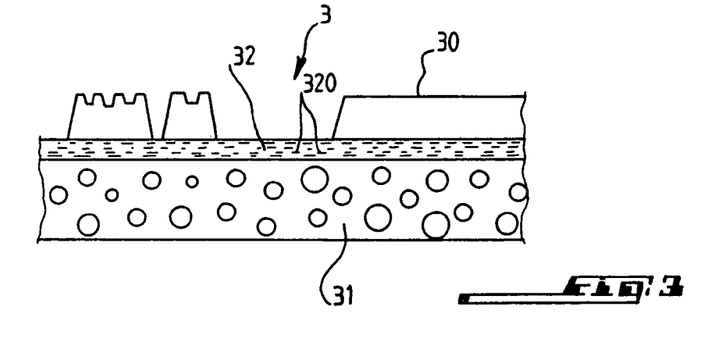
FIG. 3 is a schematic view in section of a compressible plate according to the invention, provided with a stabilization layer between the photopolymer layer and the compressible layer.

Referring now to FIG. 3, there is illustrated another compressible printing plate according to the invention. This plate 3 is provided with a stabilization layer 32 between photopolymer layer 30 and compressible layer 31.

This stabilization layer 32 is made from an elastomer and fibers, and is preferably configured in the form of a reinforcement of nonwoven or woven type.

This fibrous reinforcement 320 is preferably of open nature, in order to permit good impregnation of this reinforcement by the polymer of the stabilization layer.

The modulus of elasticity of the stabilization layer in the nip ranges between 50 and 2000 MPa, preferably between 200 and 1000 MPa, regardless of direction in the plane of the compressible plate.

If compressible layer 31 is based on SEBS, in common with layer 11 of plate 1 illustrated in FIG. 1, the polymer of stabilization layer 32 will also be made advantageously of SEBS. Nevertheless, a different polymer or mixture of polymers could be used provided it is chemically compatible with the polymers of photopolymer layer 30 and of compressible layer 31.

Preferably the polymer of this stabilization layer 32 will have a predefined refractive index for UV light. This index will be chosen to facilitate transmission of the incident energy between layers 30 and 31.

It will also be possible to add supplementary layers with refractive indices for light such that they enhance the transmission of the incident energy. UV absorbers can also be incorporated in these supplementary layers.

The function of these UV absorbers is to reduce or eliminate reflection of the UV radiation at the interface between the photopolymer layers and the compressible layer. This reflection can cause parasitic cross-linking and clogging of the reserves (zones that typically are not cross-linked in a printing full tone) in the case of small thicknesses of the photopolymer layer.

Figure 4:
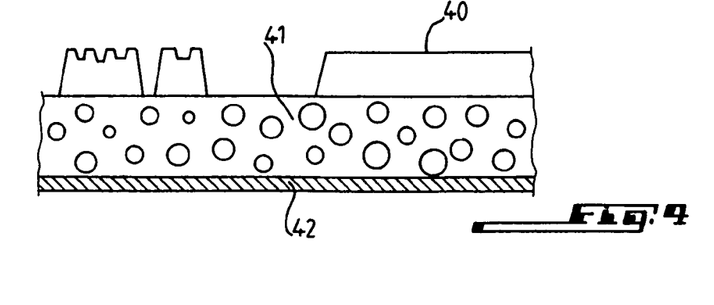
FIG. 4 is a schematic view in section of a compressible plate according to the invention, comprising a photopolymer layer, a compressible layer and a support film.

Referring now to FIG. 4, there is illustrated a compressible layer 4 comprising successively a photopolymer layer 40, a compressible layer 41 and a support film 42.

This film 42 can be made of plastic or metal material. It ensures better dimensional stability of the plate before this is positioned on a cylinder.

This film is provided more particularly on plates configured in the form of sheets.

There will now be described two practical examples of a compressible plate according to the invention, provided with a compressible layer whose compressibility can be modulated or adjusted after production of the compressible plate.

EXAMPLE 1

In a first practical example of such a plate, this is provided with a compressible layer of expanded polyurethane.

This compressible layer is obtained from a prepolymer with isocyanate terminal groups and a triol, with a chain-lengthening agent, a surfactant and a catalyst being added to the mixture. In this mixture there are incorporated monomers of the pentaerythritol tetraacrylate type and a photoinitiator of Irgacure 651® type.

The proportions by weight of these constituents in the mixture are as follows: about 85% of polyol, about 8% of triol, about 1% of chain-lengthening agent with terminal isocyanate groups, about 4% of tetraacrylate and about 2% of photoinitiator.

During extrusion of this mixture, it is expanded by addition water in a proportion of 0.1 parts by weight of polyol. The primary system for creating interlinked polymer chains is a cross-linking system of isocyanate type.

A layer of polyurethane-base photopolymer is then applied, this layer being made to adhere to the compressible layer, or in other words an irreversible bond being established between the two layers, by interpenetration of surface polymer chains.

Thus, in the compressible plate obtained, the cross-linking system of the isocyanate type has already been activated to form the polyurethane.

In contrast, the compressible layer contains monomers of the pentaerythritol tetraacrylate type that have not yet reacted with the other constituents of the compressible layer.

The printing plate obtained can be irradiated at a later time with UV radiation in order to initiate cross-linking of the tetraacrylate and to harden the compressible layer.

In this case, therefore, the monomers of the pentaerythritol tetraacrylate comprise, for creation of other bonds between the polymer chains, a system that is still latent after production of the plate and that can be activated at a later time.

In this particular example, the UV radiation step can be accomplished in particular during the development of the photopolymer layer of the printing plate.

Thus the cross-linking that takes place in the compressible layer during production of the printing plate makes it possible to obtain a compressible layer that is soft but chemically resistant. This compressible layer ensures that the photosensitive layer can be developed and that four-color printing in half-tones can be optimized.

The complementary cross-linking system due to the presence of monomers of pentaerythritol tetraacrylate type makes it possible to harden the compressible layer during, in particular, irradiation of the printing plate. The parts of the compressible layer that become harder ensure that full tones of great quality can be printed.

When UV irradiation is used to harden the compressible layer selectively, this selective hardening is achieved without a supplementary operation, which is a noteworthy advantage for the photoengravers.

Figure 5:
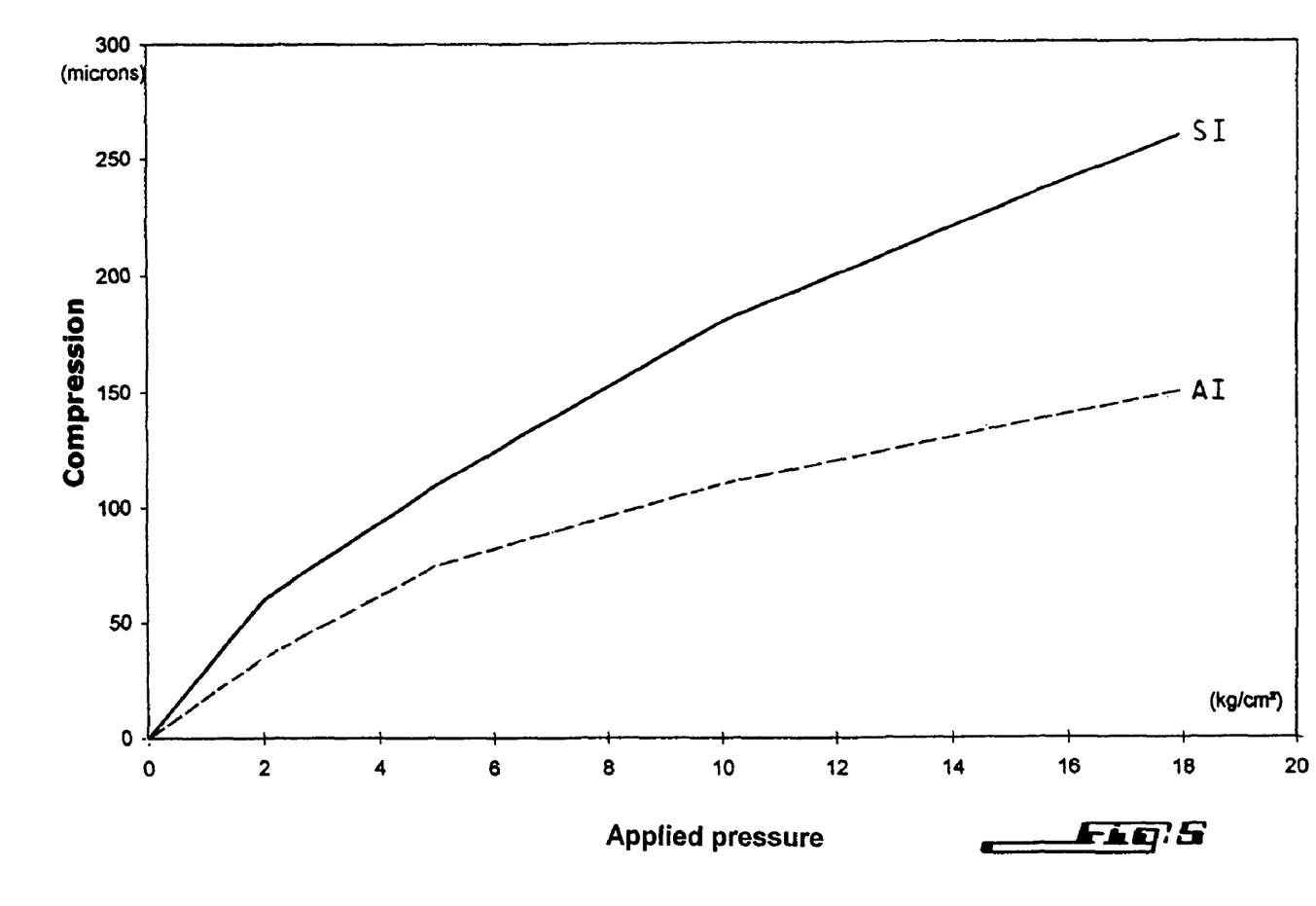
FIG. 5 shows two curves of the plane compression between parallel platens of a compressible plate according to the invention (in microns) as a function of the pressure exerted on the plate (in kg/cm$^2$).

Referring now to FIG. 5, there are illustrated two curves of the compression (in microns) of the printing plate just described in the foregoing example as a function of the pressure exerted (in kg/cm$^2$). It is noted that the ratio between the tangent moduli of the two layers SI and AI ranges from 1 to 1.75.

Curve SI (—) corresponds to tests performed with the printing plate after it has been produced and before it has been subjected to UV irradiation.

Curve AI ( - - - ) corresponds to tests performed with this same plate, but in zones that have been subjected to UV irradiation.

These two curves AI and SI demonstrate that the printing plate has been hardened to a noteworthy extent in the zones subjected to UV irradiation.

Of course, the irradiation with UV light can be modulated in duration and energy, thus ensuring that the hardness imparted to the compressible layer can also be modulated.

In the example mentioned hereinabove, the compressible plate is hardened in a spatial distribution corresponding to the image to be printed.

Nevertheless, it would be possible to choose any other spatial distribution that would be favorable for printing. The printing plate could also be subjected to uniform irradiation, in order to harden the plate uniformly.

In practice, the photoengraver or the printer therefore has the opportunity to choose the compressibility of the printing plate to match his needs.

EXAMPLE 2

Another example of a printing plate according to the invention, wherein the compressibility can be modulated, will now be described.

This printing plate is provided with a compressible layer of SEBS.

Thus this compressible layer is obtained by extrusion of a mixture containing SEBS, expanded and non-expanded microspheres of the Expancell® type, functional monomers of the pentaerythritol tetraacrylate type and one or more photoinitiators of the Irgacure 651® type.

These functional monomers represent between 2 and 10% by weight of the mixture and preferably about 5% by weight, while the other constituents are present in the mixture in the following proportions by weight:

SEBS, from 46 to 94% and preferably between 61.95 and 83.65%;
coloring agents from 0.01 to 1% and preferably 0.05%;
microspheres from 1 to 10% and preferably 3 to 5%;
polymeric additives from 3 to 15%;
protective agents from 0.1 to 3%;
photoactivators from 0.2 to 5%;
fillers from 0 to 10% and preferably 5%.

The compressible layer is cross-linked by electron bombardment with a dose of about 25 to 250 kGy during production of the compressible plate.

The functional monomers in the compressible plate produced in this way have not yet been activated, but they can be activated by means of subsequent UV exposure in such a way that the compressible layer is hardened selectively, as already described for the first example hereinabove.

It would also be possible to envision other examples of a compressible plate, containing different functional monomers that can be activated by different influences, in order that the compressibility of the plate can be modulated even more.

The functional monomers provided in the compressible layer can lead to the creation of other bonds between the polymer chains, as shown by the two examples illustrated hereinabove.

There can also be provided monomers that, when they are activated, destroy polymer chains.

In this case the compressible layer obtained during production of the compressible plate will be relatively hard, but this layer can be made more flexible at a later time when these monomers are activated.

In general, a printing plate whose compressibility can be modulated is amenable to better standardization of its thickness.

Above all, the modulation of the compressibility in the plate makes it possible to obviate the use of different, more or less compressible self-sealing adhesives, of two plates of different thickness or even of several different plates, as is the case in the prior art.

In general, a compressible, ready-to-use plate according to the invention has a thickness of between 0.76 and 6.25 mm.

Preferably it has a thickness of between 1.0 and 2.8 mm.

It can also have a thickness which is standardized in the industry, and which can be 1.14 mm, 1.70 mm, 2.29 mm, 2.54 mm, 2.70 mm, 2.84 mm, 3.17 mm, 3.94 mm or else 4.32 mm.

The compressible plate can also have a standardized thickness of 1.59 mm, 2.15 mm or 2.74 mm. This thickness corresponds to that of a standardized plate increased by the thickness of a standard compressible layer.

Finally, the printing plate according to the invention preferably has a standardized thickness of 1.59 mm, 2.15 mm, 2.29 mm or 2.7 mm.

The flexographic printing plate according to the invention can be used in the usual way.

In particular, it is selectively fixed on a sleeve or support film before UV irradiation, specifically at the sites that contain the zones to be printed.

As a result, time can be saved during the mounting process, the risks of human errors can be avoided and perfect reference marking can also be guaranteed when the compressible plate is developed after the mounting process.

UV irradiation of the printing plate can be accomplished by standard or digital means, after it has been mounted on a film or on a sleeve.

The reference symbols appended to the technical characteristics specified in the claims are provided merely to improve understanding thereof without limiting the scope thereof.

The invention claimed is:

1. Process for making a compressible flexographic printing plate comprising the steps of
   (a) preparing a photopolymer layer;
   (b) preparing a compressible layer of a material comprising (i) voids forming between 10% and 60% of the volume of the material, (ii) at least 70% by weight of a polymer or a polymer mixture that is chemically compatible with the photopolymer, and (iii) at least one functional monomer reactive to a predetermined activation means comprising U.V. radiation; wherein the polymer in the compressible layer is formed using a first activation means selected from the group consisting of heat, isocyanates, electron bombardment and x-rays; wherein the at least one functional monomer reactive to a predetermined activation means comprising U.V. radiation does not react in response to the first activation means;
   (c) exposing the compressible layer to the first activation means and then fastening the photopolymer layer and the compressible layer to one another, either directly or indirectly, without the use of a separate adhesive layer;
   (d) after fastening the photopolymer layer and the compressible layer to one another, exposing the flexographic printing plate to the predetermined activation means comprising U.V. radiation such that at least some of the at least one functional monomer reacts with the polymer in the compressible layer wherein zones of different compressibility are obtained within the compressible layer because at least some of the at least one functional monomer reacts in response to the predetermined activation means comprising U.V. radiation.

2. A process according to claim 1, wherein the compressible layer comprises: 1 to 10% by weight of microspheres or blowing agents.

3. A process according to claim 1, wherein the compressible layer comprises between 0.1 and 3% by weight of protective agents, selected from the group consisting of antioxidants, ozone inhibitors and waxes.

4. A process according to claim 1, wherein the compressible layer comprises a polymer selected from the group consisting of:
   (i) elastomers of the styrene copolymer type,
   (ii) thermoplastic elastomers,
   (iii) thermoplastic polyurethanes, and
   (iv) elastomers of the acrylonitrile type.

5. A process according to claim 4, wherein the compressible layer also comprises a, polymer selected from the group consisting of:
   (i) functionalized polyolefins,
   (ii) terpolymers of ethylene, vinyl acetate or acrylate ester with maleic anhydride or glycidyl methacrylate;
   (iii) copolymers of ethylene and actene, or of propylene and hexane or decene,
   (iv) amide polyester or polyether, and
   (v) elastomers of the EPDM, NBR or HNBR type.

6. A process according to claim 4, wherein the compressible layer further comprises mono functional or multifunctional acrylates or methacrylates.

7. A process according to claim 4, wherein the compressible layer also comprises mineral fillers.

8. A process according to claim 4, wherein the compressible layer also comprises coloring agents.

9. A process according to claim 1, wherein the predetermined activation means also comprises at least one photoactivator or photoinitiator responsive to U.V. radiation.

10. A process according to claim 1, wherein at least one additional layer is interposed between the compressible layer and the photopolymer layer.

11. A process according to claim 10, wherein the additional layer comprises fibrous reinforcement.

* * * * *